(12) United States Patent
Iwasawa et al.

(10) Patent No.: US 11,056,389 B2
(45) Date of Patent: Jul. 6, 2021

(54) METHOD OF MANUFACTURE OF GROUP III NITRIDE SEMICONDUCTOR

(71) Applicant: Panasonic Intellectual Property Management Co., Ltd., Osaka (JP)

(72) Inventors: Ayako Iwasawa, Osaka (JP); Yoshio Okayama, Osaka (JP); Takatoshi Okamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/831,321

(22) Filed: Mar. 26, 2020

(65) Prior Publication Data
US 2020/0365462 A1 Nov. 19, 2020

(30) Foreign Application Priority Data
May 17, 2019 (JP) .............................. JP2019-093647

(51) Int. Cl.
*H01L 21/78* (2006.01)
*H01L 21/268* (2006.01)
*H01L 21/02* (2006.01)

(52) U.S. Cl.
CPC .... *H01L 21/7813* (2013.01); *H01L 21/02002* (2013.01); *H01L 21/268* (2013.01)

(58) Field of Classification Search
None
See application file for complete search history.

(56) References Cited

U.S. PATENT DOCUMENTS

| 2006/0273334 A1 | 12/2006 | Nagai et al. |
| 2012/0183809 A1 | 7/2012 | Kinoshita et al. |

(Continued)

FOREIGN PATENT DOCUMENTS

| JP | 2006-324324 | 11/2006 |
| JP | 2013-542608 | 11/2013 |

(Continued)

*Primary Examiner* — Alexander G Ghyka
(74) *Attorney, Agent, or Firm* — Wenderoth, Lind & Ponack, L.L.P.

(57) ABSTRACT

A method for manufacturing a group III nitride semiconductor without causing adverse effects on device characteristics includes: preparing a group III nitride substrate having a first group III nitride layer and a second group III nitride layer laminated in this order from a back-surface side to a front-surface side, the first group III nitride layer being a layer having a transmittance of 60% or more for a predetermined wavelength of 400 nm to 700 nm, the second group III nitride layer being a layer provided on the first group III nitride layer and containing impurity oxygen in a concentration of $1 \times 10^{20}$ cm$^{-3}$ or more and having a transmittance of 0.1% or less for the predetermined wavelength; forming a device structure on the front-surface side of the group III nitride substrate; and forming an internal altered layer in the first group III nitride layer by multiphoton absorption using a laser beam applied from the first group III nitride layer side on the back-surface side of the group III nitride substrate with a focal point set in front of the second group III nitride layer, and dividing the group III nitride substrate at the internal altered layer serving as a boundary.

8 Claims, 10 Drawing Sheets

(56) References Cited

U.S. PATENT DOCUMENTS

| | | |
|---|---|---|
| 2013/0244364 A1 | 9/2013 | Gardner et al. |
| 2014/0206178 A1* | 7/2014 | Shreter ............... H01L 21/0254 |
| | | 438/478 |
| 2016/0153120 A1* | 6/2016 | Hashimoto ............. C30B 25/02 |
| | | 428/220 |
| 2016/0284944 A1 | 9/2016 | Narita et al. |
| 2017/0025276 A1 | 1/2017 | Hirata |
| 2017/0279006 A1 | 9/2017 | Gardner et al. |
| 2017/0294463 A1 | 10/2017 | Yamazaki et al. |
| 2018/0374699 A1* | 12/2018 | Yonkee ................... H01L 33/32 |
| 2019/0088816 A1 | 3/2019 | Mori et al. |
| 2020/0176305 A1* | 6/2020 | Ishibashi ................... B32B 7/04 |
| 2020/0299862 A1* | 9/2020 | Fukuda ................... C23C 16/34 |

FOREIGN PATENT DOCUMENTS

| | | |
|---|---|---|
| JP | 2014-084263 | 5/2014 |
| JP | 2016-184718 | 10/2016 |
| JP | 2017-028072 | 2/2017 |
| JP | 2017-183600 | 10/2017 |
| JP | 2017-195367 | 10/2017 |
| JP | 2019-055901 | 4/2019 |
| WO | 2011/037251 | 3/2011 |

\* cited by examiner

METHOD OF MANUFACTURE OF GROUP III NITRIDE SEMICONDUCTOR

TECHNICAL FIELD

The present disclosure relates to a method for manufacturing a group III nitride semiconductor.

BACKGROUND

A monocrystalline group III nitride semiconductor substrate (hereinafter, referred to as "GaN substrate" as an example) has been used as a component of LEDs of blue wavelengths for white lighting, laser diodes of ultraviolet to blue wavelengths used for reading Blu-Ray or providing an illuminant for welding, and power devices used for frequency conversion in a power system or for control of motors.

A GaN substrate is typically circular in shape with a thickness of 300 to 700 μm and a diameter of 50 to 150 mm. Typically, a GaN substrate is transparent to visible light with a transmittance of 60% or more.

FIGS. 5A through 5F represent an example of a method for fabricating a device structure from a GaN substrate. FIGS. 5A through 5F are schematic cross sectional views representing each step of an exemplary manufacturing process producing a device from a GaN substrate.

(1) First, a GaN substrate 32 is prepared (FIG. 5A).

(2) A functional layer 14 is laminated on a surface of the GaN substrate using metal organic vapor phase epitaxy method (MOCVD method) (FIG. 5B).

(3) An insulating film and an electrode 15, which are non-transparent, are formed on the functional layer 14 (FIG. 5C), and a plurality of split grooves is formed (FIG. 5D).

(4) The GaN substrate 32 with a plurality of device structures formed on one of its surfaces is ground and polished to a thinner thickness of 50 to 100 μm.

(5) Optionally, an electrode 33 is formed on the back surface of the GaN substrate (FIG. 5E).

(6) The GaN substrate 32 is divided into individual devices 34 by dicing or cleaving (FIG. 5F).

The individual devices 34 are wired, and tested for external appearance, electrical characteristics, and reliability. Upon passing the tests, the devices 34 become available for a wide range of applications.

A GaN substrate is more expensive than Si and GaAs semiconductor materials. In order to efficiently process GaN crystals into a GaN substrate without waste, known GaN substrate manufacturing techniques are intended to improve yield by preventing cracking that occurs in the process of dividing the substrate, as disclosed in JP-A-2014-84263, or reduce material loss by dividing the substrate with the use of a laser, as disclosed in JP-A-2017-183600.

A SiC substrate is as expensive as a GaN substrate. In order to produce a reusable SiC substrate, JP-A-2017-28072 discloses dividing a SiC substrate having a functional layer and an electrode on one of its surfaces.

SUMMARY

In the method described in JP-A-2014-84263, a first and a second layer of different impurity concentrations are grown on a substrate, and a laser beam of 8 to 12 μm wavelength is applied to the substrate to divide the substrate with the heat of absorption that generates in the second layer. However, if this method is used to apply a laser beam from the back side of a substrate opposite the surface bearing a device structure, the high incident energy may result in producing a large amount of heat, and heating the device structure on the front side of the substrate. The device with such heat history may fail to provide the desired characteristics or reliability, making it difficult to use the device for the intended applications.

The method described in JP-A-2017-183600 divides crystals by focusing a laser beam to one spot, instead of using heat of absorption. The method takes advantage of a phenomenon called multiphoton absorption, which occurs when a laser beam is focused to one spot, to form an altered layer inside crystals, and the crystals are divided at the altered layer serving as a boundary.

However, if this method is used to apply a laser beam to a substrate from the side opposite the surface bearing a device structure, a part of unfocused laser beam and non-working laser beam reaches the surface device structure. The laser beam having reached the device structure produces heat as it becomes converted into heat by a non-transparent material such as an electrode and an insulating film. The heat affects the functional layer and the electrode film, and creates problems in the device, making it difficult to use the device for the intended applications, as with the case of JP-A-2014-84263.

JP-A-2017-28072 is intended for SiC substrate, and does not describe anything about the adverse effect on the surface device structure of the substrate. The method described in this related art should also cause the same heat problem described above in conjunction with JP-A-2017-183600 for the device structure.

The present disclosure is intended to provide a solution to the heat problem created in devices when a laser beam is applied to divide a substrate having a surface device structure, and an object of the present disclosure is to provide a group III nitride semiconductor manufacturing method that enables a substrate having a surface device structure to be divided by laser application.

A group III nitride substrate manufacturing method according to the present disclosure includes:

preparing a group III nitride substrate having a first group III nitride layer and a second group III nitride layer laminated in this order from a back-surface side to a front-surface side, the first group III nitride layer being a layer having a transmittance of 60% or more for a predetermined wavelength of 400 nm to 700 nm, the second group III nitride layer being a layer provided on the first group III nitride layer and containing impurity oxygen in a concentration of $1 \times 10^{20}$ cm$^{-3}$ or more and having a transmittance of 0.1% or less for the predetermined wavelength;

forming a device structure on the front-surface side of the group III nitride substrate; and forming an internal altered layer in the first group III nitride layer by multiphoton absorption using a laser beam applied from the first group III nitride layer side on the back-surface side of the group III nitride substrate with a focal point set in front of the second group III nitride layer, and dividing the group III nitride substrate at the internal altered layer serving as a boundary.

In a group III nitride semiconductor manufacturing method according to the present disclosure, a second group III nitride layer having a low transmittance for a laser beam is formed on the back-surface side. In this way, a laser beam that travels through toward the front-surface side after its application from the back-surface side can be converted into heat in the second group III nitride layer. This makes it possible to reduce degradation of the characteristics of the device structure formed on the front-surface side.

DESCRIPTION OF EMBODIMENTS

Figure 1A:
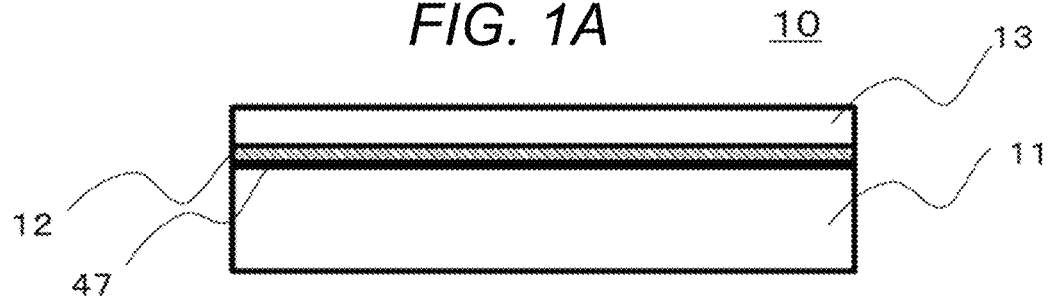
FIG. 1A is a schematic cross sectional view representing a step in a group III nitride semiconductor manufacturing method according to First Embodiment.

A group III nitride semiconductor manufacturing method according to a first aspect of the present disclosure includes:

preparing a group III nitride substrate configured from a first group III nitride layer and a second group III nitride layer laminated in this order from a back-surface side to a front-surface side, the first group III nitride layer being a layer having a transmittance of 60% or more for a predetermined wavelength of 400 nm to 700 nm, the second group III nitride layer being a layer provided on the first group III nitride layer and containing impurity oxygen in a concentration of $1\times10^{20}$ cm$^{-3}$ or more and having a transmittance of 0.1% or less for the predetermined wavelength;

forming a device structure on the front-surface side of the group III nitride substrate; and forming an internal altered layer in the first group III nitride layer by multiphoton absorption using a laser beam applied from the first group III nitride layer side on the back-surface side of the group III nitride substrate with a focal point set in front of the second group III nitride layer, and dividing the group III nitride substrate at the internal altered layer serving as a boundary.

A group III nitride semiconductor manufacturing method according to a second aspect of the present disclosure may be such that, in the first aspect, the preparing of the group III nitride substrate includes:

preparing a seed substrate;

forming the first group III nitride layer on the seed substrate by crystalline growth;

separating the seed substrate;

grinding and polishing a front surface of the first group III nitride layer to planarize the surface;

forming the second group III nitride layer on a seed substrate by crystalline growth, using oxide vapor phase epitaxy method;

separating the seed substrate;

grinding and polishing a front surface of the second group III nitride layer; and bonding the separated first group III nitride layer and the separated second group III nitride layer to each other.

A group III nitride semiconductor manufacturing method according to a third aspect of the present disclosure may be such that, in the second aspect, the preparing of the group III nitride substrate further includes forming a third group III nitride layer on the second group III nitride layer by crystalline growth, the third group III nitride layer being a layer having a transmittance of 60% or more for the predetermined wavelength.

A group III nitride semiconductor manufacturing method according to a fourth aspect of the present disclosure may be such that, in any of the first to third aspects, the device structure includes a functional layer, an electrode, and an insulating film.

A group III nitride semiconductor manufacturing method according to a fifth aspect of the present disclosure may be such that, in any of the first to fourth aspects, the group III nitride substrate is formed of GaN.

Findings That Led to Group III Nitride Semiconductor Manufacturing Method of Present Disclosure As used herein, "transmittance" is defined as the proportion of transmitted light when light having a wavelength of 400 to 700 nm, longer than the absorption edge wavelength of GaN, is applied. As used herein, "transparent" is defined as having a transmittance of 60% or more when light having the predetermined wavelength of 400 to 700 nm is applied.

A GaN substrate, an example of a group III nitride substrate, is typically obtained as an independent substrate using a single crystal-growth method such as hydride vapor phase epitaxy method (hereinafter, HVPE method). Accordingly, it has been difficult to produce a GaN substrate having a plurality of layers of greatly different transmittances by varying the growth conditions, for example, by adjusting the flow rate of group V and group III feedstock gases, or using different impurity doping methods.

This is because an independent GaN substrate, when produced by combining different GaN crystal-growth methods, involves cracking or breakage due to the crystals having different properties, such as different lattice constants.

Recent technological advances in GaN crystal growth as represented by oxide vapor phase epitaxy method (hereinafter, OVPE method) have opened the door to the possibility of producing a practically usable GaN substrate without cracking or breakage, even when crystal growth methods involving greatly different transmittances are used together.

OVPE method is a method in which an oxide gas of a group III element and a nitride-containing gas are blown against a seed substrate to react for growth of group III nitride crystals on the seed substrate. For example, a $Ga_2O_3$ powder and a carbon powder are reacted at high temperature to generate an oxide gas of a group III element and a $Ga_2O$ gas, and the generated $Ga_2O$ gas is reacted with ammonia gas on a seed substrate ($Ga_2O+2NH_3 \rightarrow 2GaN+H_2O+2H_2$) to grow GaN crystals.

Figure 3:
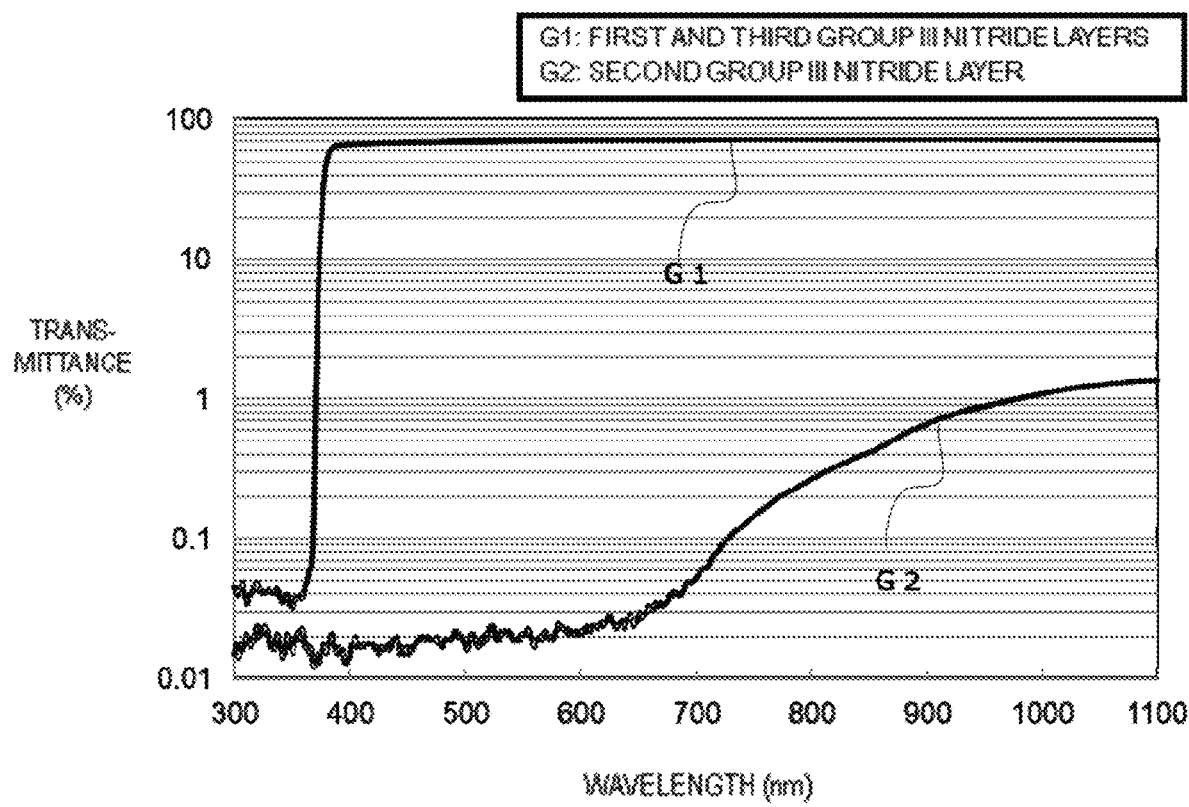
FIG. 3 is an explanatory diagram representing the difference in the transmittance of the first and third group III nitride layers and the second group III nitride layer of a GaN substrate at different wavelengths of light.

The present inventors conducted intensive studies, and found that a GaN substrate having a surface device structure can be divided by taking advantage of the difference in the transmittance of GaN crystals produced by using different crystal growth methods in combination as represented in FIG. 3. This has led to the conclusion that this technique can be used as a means to obtain a reusable GaN substrate. The finding led to a group III nitride semiconductor manufacturing method according to the present disclosure.

An embodiment of a group III nitride semiconductor manufacturing method of the present disclosure is described below, with reference to the accompanying drawings. In the drawings, essentially like elements are referenced by like numerals.

First Embodiment

FIGS. 1A through 1D are schematic cross sectional views representing each step in a group III nitride semiconductor manufacturing method according to First Embodiment.

Figure 1B:
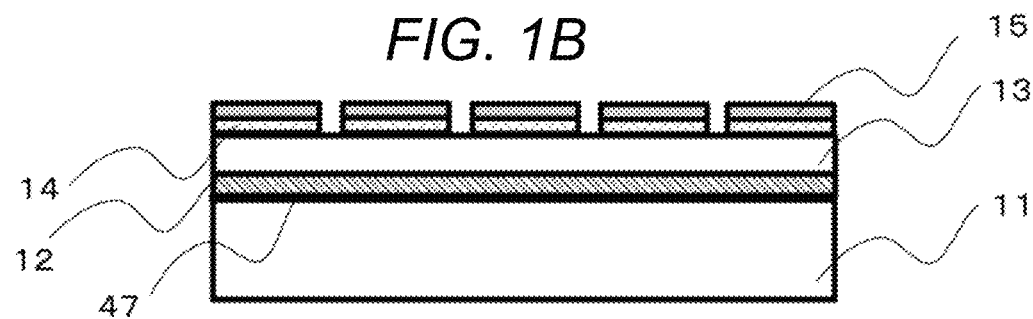
FIG. 1B is a schematic cross sectional view representing a step in a group III nitride semiconductor manufacturing method according to First Embodiment.
Figure 1C:
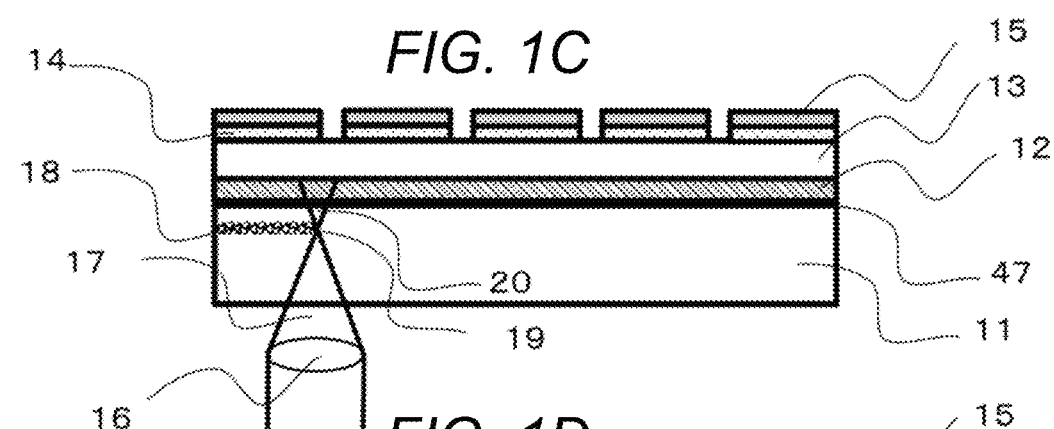
FIG. 1C is a schematic cross sectional view representing a step in a group III nitride semiconductor manufacturing method according to First Embodiment.
Figure 1D:
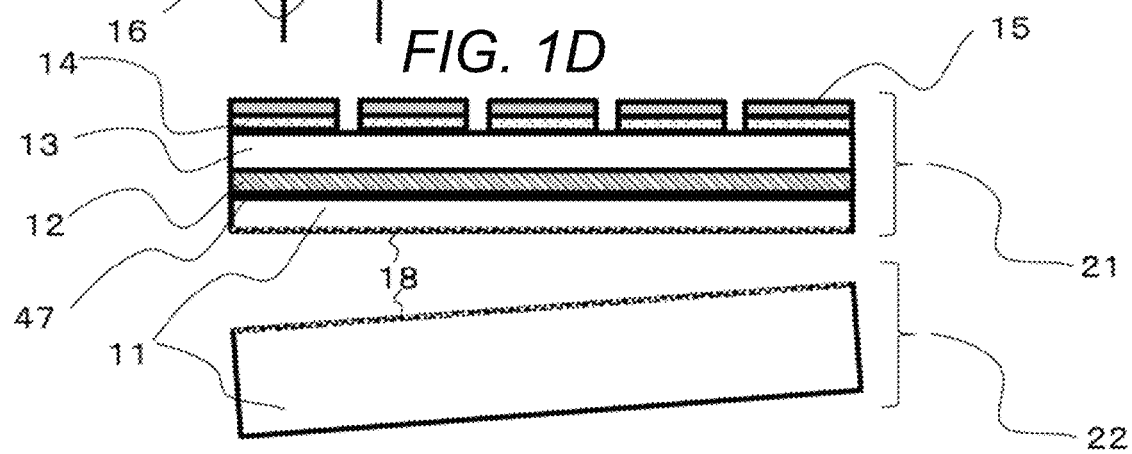
FIG. 1D is a schematic cross sectional view representing a step in a group III nitride semiconductor manufacturing method according to First Embodiment.

The group III nitride semiconductor manufacturing method according to First Embodiment includes:

preparing a group III nitride substrate configured from a first group III nitride layer 11, a second group III nitride layer 12, and a third group III nitride layer 13 laminated in this order from a back-surface side to a front-surface side (FIG. 1A);

forming a device structure on the front-surface side of the group III nitride substrate (FIG. 1B); and dividing the group III nitride substrate by applying a laser beam from the first group III nitride layer side on the back-surface side of the group III nitride substrate (FIG. 1C, FIG. 1D).

The first group III nitride layer 11 has a transmittance of 60% or more for a predetermined wavelength of 400 nm to 700 nm. The second group III nitride layer, formed on the first group III nitride layer, has an impurity oxygen concentration of $1 \times 10^{20}$ cm$^{-3}$ or more, and a transmittance of 0.1% or less for the predetermined wavelength. The third group III nitride layer 13 has a transmittance of 60% or more for the predetermined wavelength. In the step of dividing the group III nitride substrate, the laser beam is focused in front of the second group III nitride layer to form an internal altered layer by way of multiphoton absorption, and the group III nitride substrate is divided at the internal altered layer serving as an initiation point of separation.

In the group III nitride semiconductor manufacturing method according to First Embodiment, the second group III nitride layer 12 having a lower transmittance for the laser beam is provided on the back-surface side opposite the front-surface side where the third group III nitride layer 13 forming a device structure is provided. In this way, the laser beam focused in front of the second group III nitride layer from the back-surface side can be converted into heat as it passes through the second group III nitride layer toward the front-surface side, making it possible to reduce degradation of the characteristics of the device structure formed on the surface of the third group III nitride layer on the front-surface side.

The following describes each step of the group III nitride semiconductor manufacturing method.

Preparation of Group III Nitride Substrate (FIG. 1A)

Figure 4A:
FIG. 4A is a schematic cross sectional view representing a step of a method for producing a GaN substrate having transparent layers and a photothermal layer according to First Embodiment.
Figure 4B:
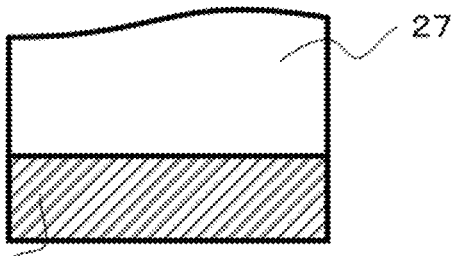
FIG. 4B is a schematic cross sectional view representing a step of a method for producing a GaN substrate having transparent layers and a photothermal layer according to First Embodiment.
Figure 4C:
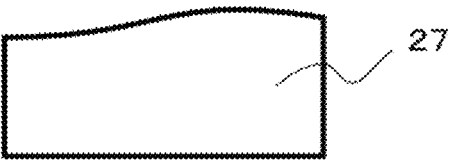
FIG. 4C is a schematic cross sectional view representing a step of a method for producing a GaN substrate having transparent layers and a photothermal layer according to First Embodiment.
Figure 4D:
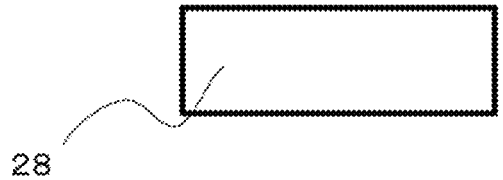
FIG. 4D is a schematic cross sectional view representing a step of a method for producing a GaN substrate having transparent layers and a photothermal layer according to First Embodiment.
Figure 4E:
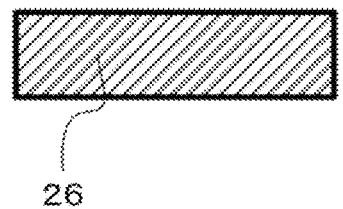
FIG. 4E is a schematic cross sectional view representing a step of a method for producing a GaN substrate having transparent layers and a photothermal layer according to First Embodiment.
Figure 4F:
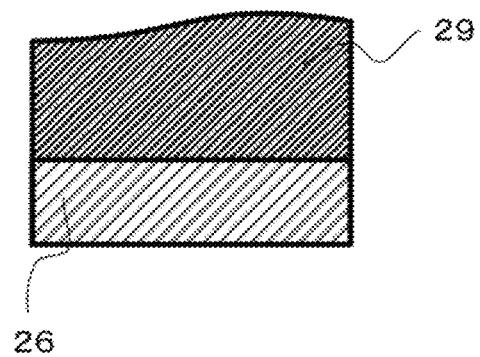
FIG. 4F is a schematic cross sectional view representing a step of a method for producing a GaN substrate having transparent layers and a photothermal layer according to First Embodiment.
Figure 4G:
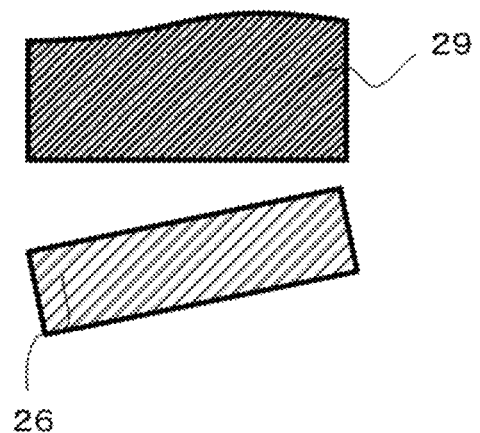
FIG. 4G is a schematic cross sectional view representing a step of a method for producing a GaN substrate having transparent layers and a photothermal layer according to First Embodiment.
Figure 4H:
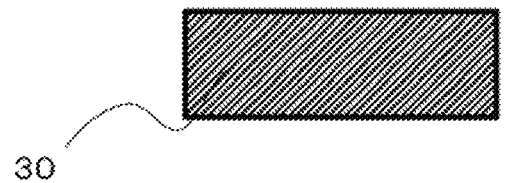
FIG. 4H is a schematic cross sectional view representing a step of a method for producing a GaN substrate having transparent layers and a photothermal layer according to First Embodiment.
Figure 4I:
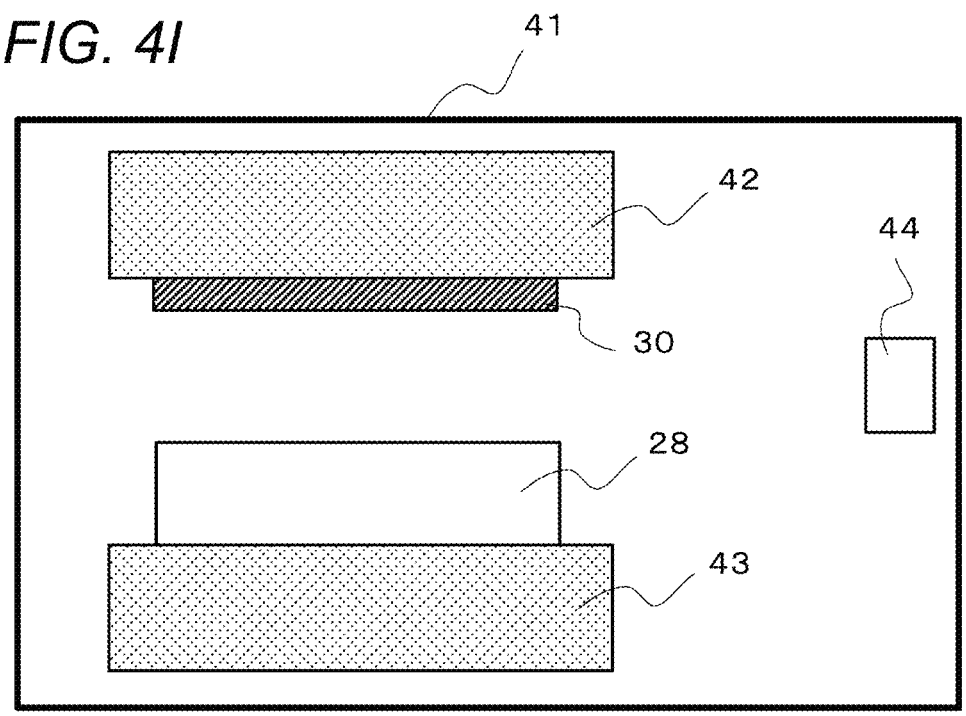
FIG. 4I is a schematic cross sectional view representing a step of a method for producing a GaN substrate having transparent layers and a photothermal layer according to First Embodiment.
Figure 4J:
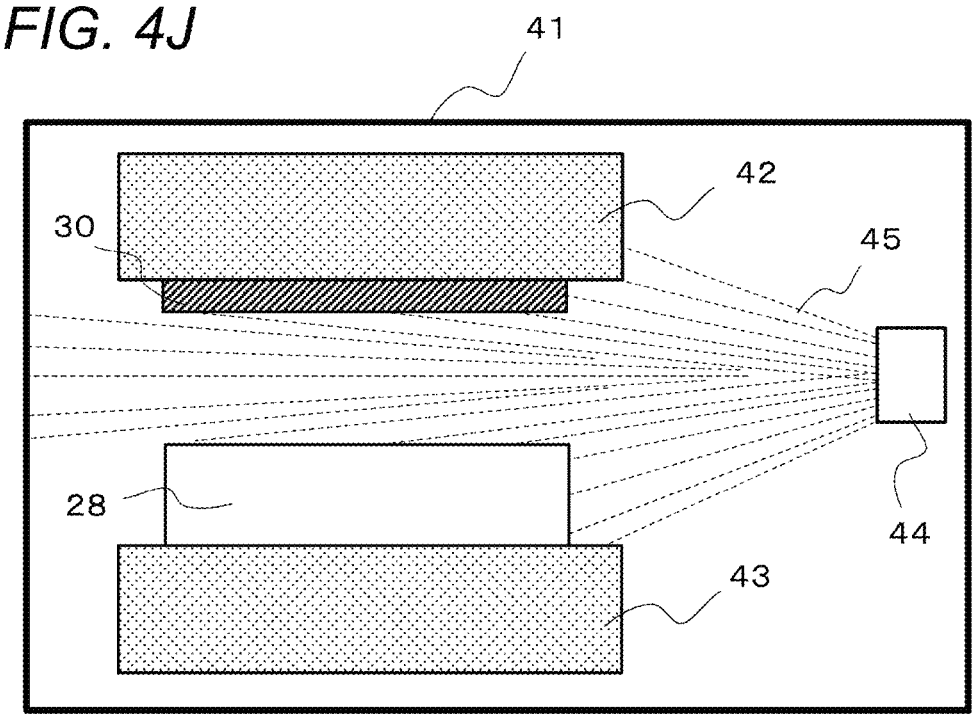
FIG. 4J is a schematic cross sectional view representing a step of a method for producing a GaN substrate having transparent layers and a photothermal layer according to First Embodiment.
Figure 4K:
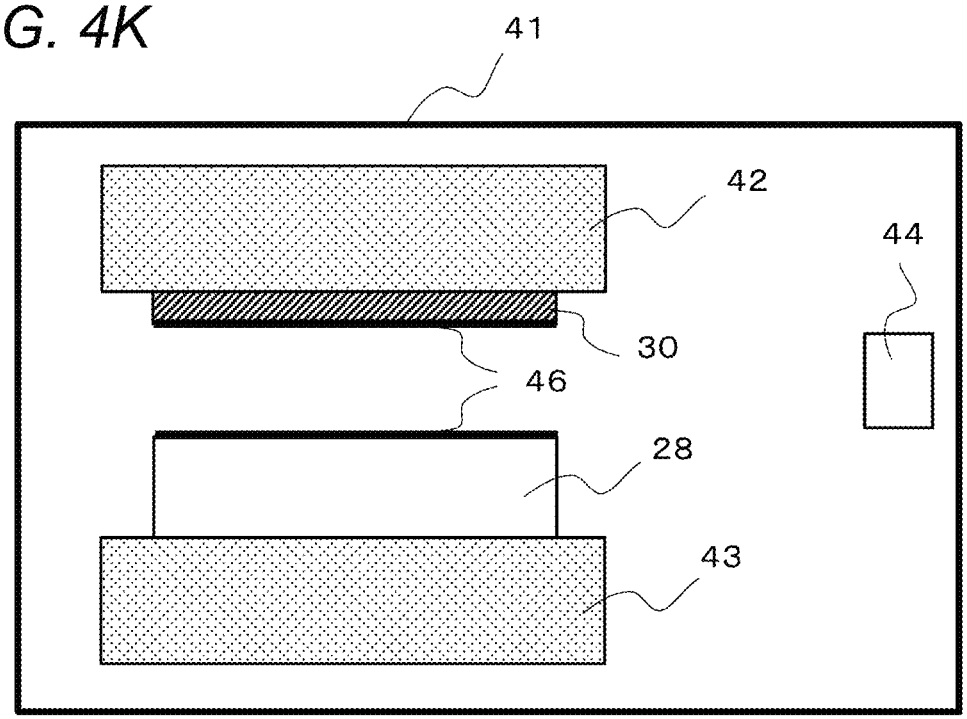
FIG. 4K is a schematic cross sectional view representing a step of a method for producing a GaN substrate having transparent layers and a photothermal layer according to First Embodiment.
Figure 4L:
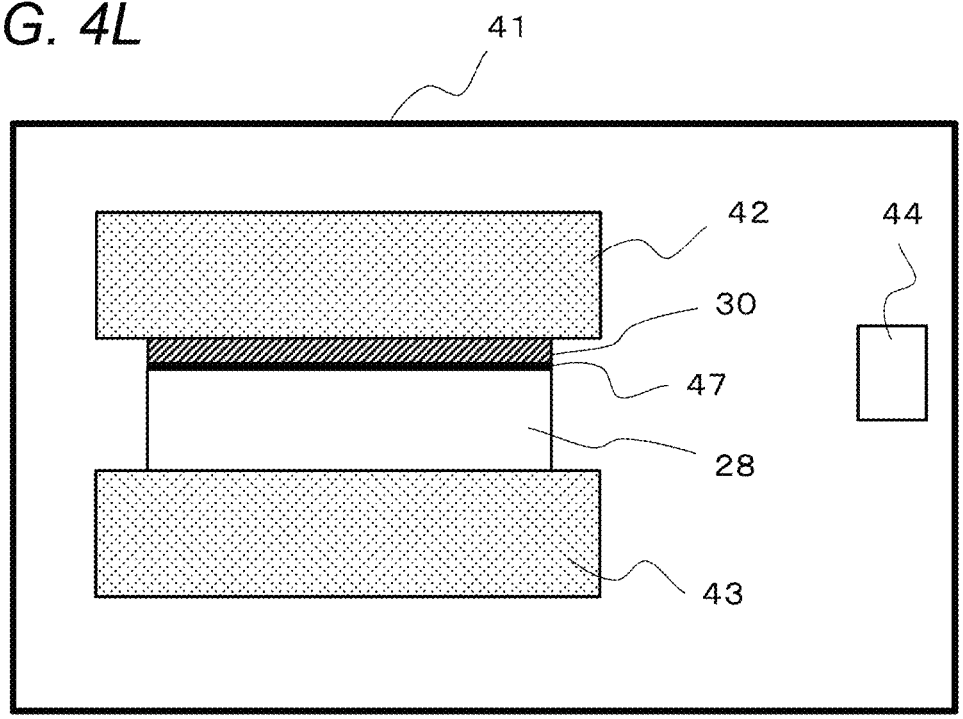
FIG. 4L is a schematic cross sectional view representing a step of a method for producing a GaN substrate having transparent layers and a photothermal layer according to First Embodiment.
Figure 4M:
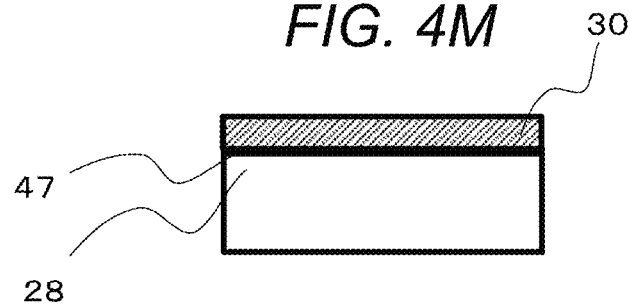
FIG. 4M is a schematic cross sectional view representing a step of a method for producing a GaN substrate having transparent layers and a photothermal layer according to First Embodiment.
Figure 4N:
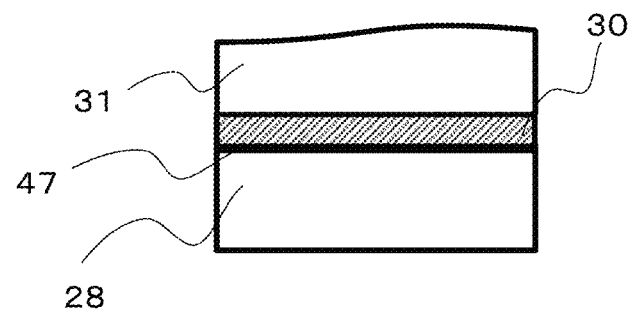
FIG. 4N is a schematic cross sectional view representing a step of a method for producing a GaN substrate having transparent layers and a photothermal layer according to First Embodiment.
Figure 4O:
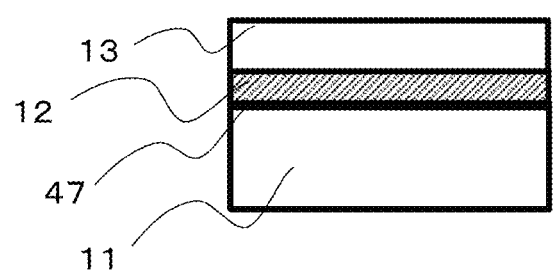
FIG. 4O is a schematic cross sectional view representing a step of a method for producing a GaN substrate having transparent layers and a photothermal layer according to First Embodiment.

FIGS. 4A through 4O are schematic cross sectional views representing each step of the method of First Embodiment producing a GaN substrate 10 (group III nitride semiconductor) having the first group III nitride layer 11 (transparent layer), the second group III nitride layer 12 (photothermal layer), and the third group III nitride layer 13. The group III nitride substrate 10 is configured from the first group III nitride layer 11, the second group III nitride layer 12, and the third group III nitride layer 13 laminated in this order from the back-surface side to the front-surface side. The steps of preparing the group III nitride substrate are described below, with reference to FIGS. 4A through 4O.

(1) A seed substrate 26 is prepared from any of, for example, sapphire, ScAlMgO$_4$, and GaN (FIG. 4A).

(2) This is followed by crystalline growth of a first group III nitride layer 27 (a first transparent layer having a transmittance of 60% or more) to a thickness of 440 μm on the seed substrate 26, using HVPE method (FIG. 4B). The material and shape of the seed substrate 26 are not particularly limited. Aside from HVPE method, crystalline growth may be achieved by using a method such as the liquid phase method (the Na flux method being a known example) or the ammonothermal method. The first group III nitride layer 27 may be doped with about $1\times10^{18}$ cm$^{-3}$ of impurity Si to form the first group III nitride layer 27 as an n-type semiconductor layer.

(3) A GaN substrate 28, an example of a group III nitride substrate having the first group III nitride layer 27, is separated from the seed substrate 26 using a known method such as etching or lift-off (FIG. 4C).

(4) After separation, the front and back surfaces of the first group III nitride layer 27 are planarized by grinding and polishing away, for example, 20 μm of the layer on each side to obtain a parallel, flat GaN substrate 28 having a thickness of 400 μm (FIG. 4D).

(5) Separately, another seed substrate 26 is prepared from, for example, any of sapphire, ScAlMgO$_4$, and GaN (FIG. 4E).

(6) This is followed by crystalline growth of a second group III nitride layer 29 (a layer that serves as a photothermal layer having a transmittance of 0.1% or less) to a thickness of 120 μm on the seed substrate 26, using OVPE method (FIG. 4F). The material and shape of the seed substrate 26 is not particularly limited. The second group III nitride layer that serves as a photothermal layer will be described in detail.

(7) The group III nitride substrate having the second group III nitride layer 29 is separated from the seed substrate 26 using a known method such as etching or lift-off (FIG. 4G).

(8) After separation, the front and back surfaces of the second group III nitride layer 29 are planarized by grinding and polishing away, for example, 10 μm of the layer on each side to obtain a parallel, flat group III nitride layer 30 having a thickness of 100 μm (FIG. 4H).

Alternatively, for the production of the group III nitride layer 30, the second nitride layer 29 having a transmittance of 0.1% or less and that serves as a photothermal layer may be formed on the seed substrate 26 by growing crystals to a thickness of, for example, 2,000 μm, and, after separation from the seed substrate 26, the second nitride layer 29 may be sliced into a plurality of layers using a known method such as with a wire saw or a laser, followed by grinding and polishing of both surfaces to obtain group III nitride layers 30 each measuring 100 μm in thickness.

(9) The GaN substrate 28 obtained in FIG. 4D and the group III nitride layer 30 obtained in FIG. 4H are bonded to each other. First, the GaN substrate 28 and the group III nitride layer 30 are placed on the wafer step jig (upper side) 42 and the wafer step jig (lower side) 43, respectively, in the chamber of an ultrahigh vacuum-compatible bonding machine, face to face with a certain distance provided between the bonding surfaces (FIG. 4I).

From the viewpoint of increasing the bonding strength between the GaN substrate 28 and the group III nitride layer 30, it is preferable that the principal surfaces of the layers be polished and planarized (for example, the planarized surface has an arithmetic mean roughness Ra of 10 nm or less as specified by JIS B 0601: 2001).

(10) The bonding surfaces are irradiated with, for example, an ion beam such as Ar, or an atomic beam 45 (FIG. 4J). This activates the bonding surfaces themselves, and forms active fine-particle films, in addition to removing the oxide film and the adsorption layer on the bonding surfaces.

(11) Application of the beam forms amorphous layers 46 at the bonding surfaces (FIG. 4K).

(12) The amorphous layers 46 join and fuse to each other upon contacting the bonding surfaces, optionally with a small applied load. This joins the layers at the joint interface 47 formed by the amorphous layers (FIG. 4L).

(13) This completes the bonded substrate (FIG. 4M).

The joint interface 47 is formed by the amorphous layers having a combined thickness of 10 nm or less. The amorphous layers become thicker as the applied energy and the irradiation time of the beam increase. The surface roughness also increases with increase of thickness. Because this makes it difficult to join the layers, the thickness of the joint interface 47 is preferably 10 nm or less. It has been confirmed that the interface can provide sufficient bonding strength when it has a thickness of several nanometers. The amorphous layers forming the joint interface 47 contain metallic components containing Ti, Cr, Ni, Fe, Al, or an alloy thereof. These metallic components occur as a result of the applied beam hitting and chipping the inner surfaces of the chamber and the surfaces of the conveyer plate, and the metals migrating to the wafer surface as metallic components.

The bonding method is not particularly limited to the foregoing method, as long as it is suited for formation of the amorphous layers. Examples of the preferred known bonding methods include a direct bonding method, in which the bonding surfaces are bonded by being heated to about 600° C. to 1,200° C. after being washed and mated to each other, and a surface activation method, in which the bonding surfaces are bonded at a low temperature of from about room temperature (for example, 25° C.) to about 400° C. after being activated with, for example, a plasma or ions following washing.

(14) The third group III nitride layer 31 (a third transparent layer) is formed by growing crystals to a thickness of 120 μm on the flat second group III nitride layer 30 of the GaN substrate, using a method such as HVPE method, as with the case of the first group III nitride layer 27 (FIG. 4N). Preferably, the third group III nitride layer 31 is doped with about $1\times10^{18}$ cm$^{-3}$ of Si to make the GaN substrate an n-type semiconductor layer, using a known technique.

(15) The surface of the third group III nitride layer 31 is ground and polished to remove 20 μm of the layer. This forms the GaN substrate (group III nitride substrate 10), 600-μm thick, having the first group III nitride layer 11 (400-μm thick), the second group III nitride layer 12 (100-μm thick), and the third group III nitride layer 13 (100-μm thick) (FIG. 4O).

The GaN substrate, produced as the group III nitride substrate 10, can be obtained through these steps.

Formation of Device Structure on Front-Surface Side of Group III Nitride Substrate (FIG. 1B)

A functional layer is laminated on a surface of the group III nitride substrate 10, for example, the GaN substrate, using MOCVD method. This is followed by formation of, for example, an electrode and an insulating film, which are non-transparent, on the functional layer, and a plurality of layout split lines is formed (FIG. 1B). This procedure is implemented as the step of forming a device structure on a surface of the group III nitride substrate 10. Here, the device structure includes, for example, the functional layer 14, the electrode, and the insulating film 15.

Division of Group III Nitride Substrate Having Surface Device Structure (FIG. 1C)

Figure 2:
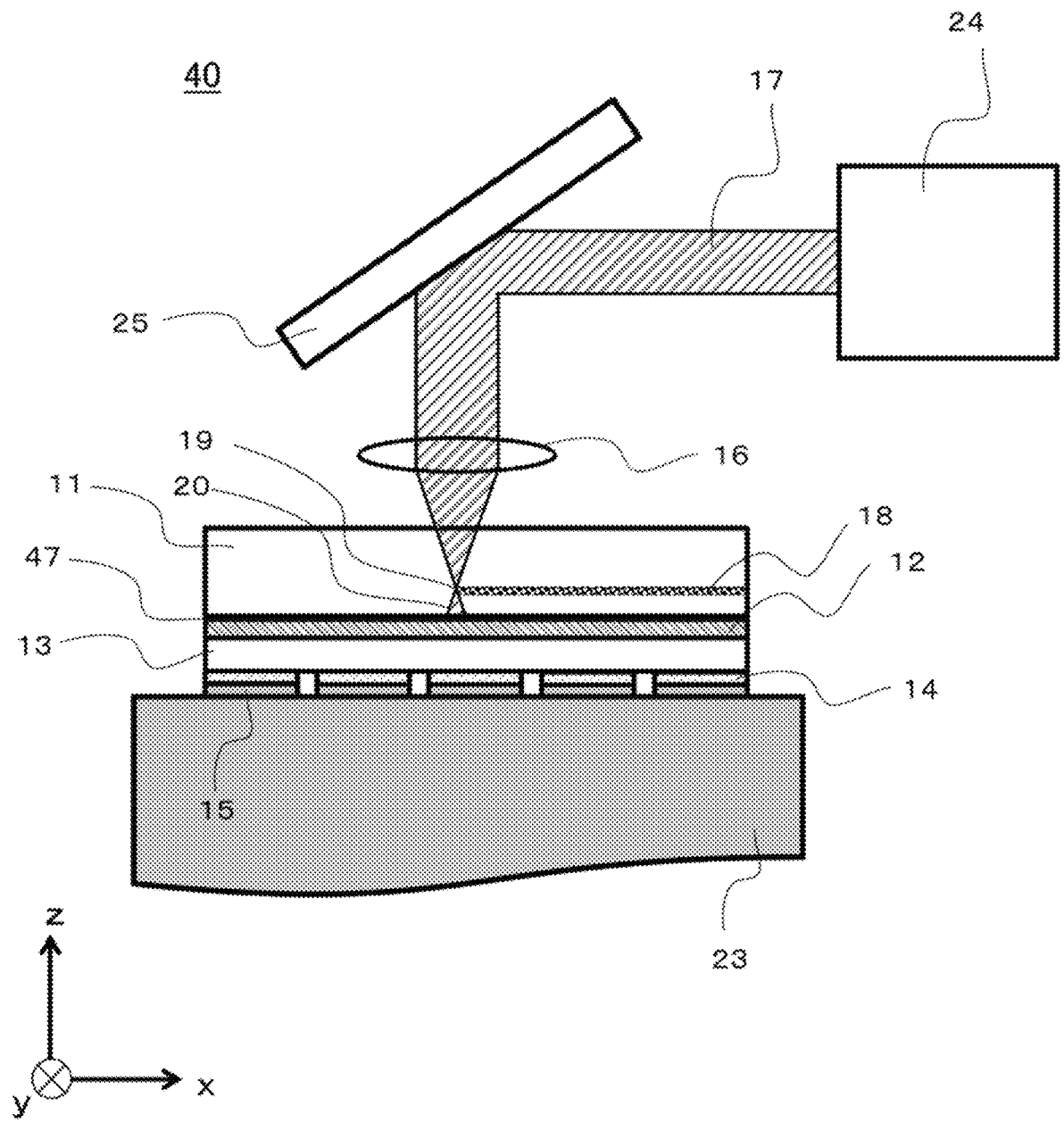
FIG. 2 is a schematic view representing a configuration of a divider according to First Embodiment.

The group III nitride substrate (e.g., a GaN substrate) having a surface device structure is disposed in a divider 40 with the back surface of the substrate facing up, as shown in FIG. 2. The back surface of the GaN substrate has been planarized.

Divider

FIG. 2 is a schematic view representing a configuration of a divider according to First Embodiment. A divider 40 includes a drive stage 23 for anchoring a group III nitride substrate, a laser oscillator 24 for oscillating a laser beam, and optical systems 25 and 16 for guiding a laser beam to the group III nitride substrate.

Drive Stage

The drive stage 23 of the divider has, for example, a hole provided for attachment of a GaN substrate, though not illustrated in the drawing. Anchoring of the GaN substrate is possible by creating a negative pressure in the hole, using, for example, a vacuum pump. The drive stage 23 is configured to be movable in along the x, y, and z axes.

Laser Oscillator

FIG. 3 is an explanatory diagram representing the difference in the transmittance of the first and third group III nitride layers, and the second group III nitride layer of the GaN substrate at different wavelengths of light. In the present embodiment, from the transmittance difference between the first and third group III nitride layers and the second group III nitride layer shown in FIG. 3, the laser oscillator 24 of the divider may oscillate a laser beam of, for example, 532-nm wavelength. The laser beam can be controlled ON/OFF at the desired position using a control signal to and from the drive stage 23, though not illustrated in the drawing.

Optical Systems

A mirror 25 and an objective lens 16 represent examples of optical systems that guide a laser beam to the group III nitride substrate.

The mirror 25 reflects 90% or more of the emitted laser beam from the laser oscillator 24 into the GaN substrate. For example, the mirror 25 is configured as a multilayer dielectric film mirror that reflects light of 532-nm wavelength.

Formation of Internal Altered Layer

The laser beam 17 through the objective lens 16 may have a focal point 19 inside the GaN substrate at a point 380 μm away from the back surface of the substrate. The focal point 19 can be set by moving the drive stage along the z axis. The objective lens 16 used in the present embodiment is a spherical aberration-corrected objective lens for microscopy that passes light of 532-nm wavelength (NA=0.85, f=2 mm, 100 times).

The laser beam 17 is capable of oscillating very short pulses of 25 ps (picosecond) or less. With such short pulses, multiphoton absorption occurs at the focal point 19 inside the first group III nitride layer 11, altering the inside of the first group III nitride layer 11, and forming, for example, an altered layer 18, 20-μm thick, at a position 380 μm away from the back surface. The altered layer 18 is formed inside the first group III nitride layer 11, and is also called an internal altered layer.

The thickness of the altered layer 18 is determined by the laser irradiation conditions. Because the in-plane variation of the altered layer is determined by the operational accuracy of the stage along the z axis, device vibrations, and the surface accuracy of the GaN substrate, it is preferable to ensure high device accuracy and high surface accuracy, with low vibrations. In this way, the altered layer can have reduced in-plane variation.

The altered layer 18 can be formed over the whole surface of the GaN substrate by applying the laser beam at a set frequency of 100 kHZ and a set scan rate of 100 mm/s so that the altered layer 18, formed per laser pulse, has a horizontal width of 3 to 5 μm.

One important thing to note about the laser process by multiphoton absorption is that, even with the ensured accuracy of aberration correction by the objective lens, an unfocused laser beam in a certain proportion of the applied laser beam, and a part of laser beam 20 that is not used for alteration travel through the GaN substrate toward the front-surface side.

In the group III nitride semiconductor manufacturing method according to First Embodiment, however, the laser beam 20 that travels through toward the front-surface side is converted into heat with the second group III nitride layer 12 of the GaN substrate prepared in the manner shown in FIG. 4F. This is possible because the second group III nitride layer 12 has a transmittance of 0.1% or less for a laser beam of 400 to 700 nm wavelength. When the transmittance is more than 0.1%, an increased proportion of applied laser beam travels through toward the device structure side, and it becomes highly likely that the device suffers from poor reliability. For this reason, a transmittance of more than 0.1% is not preferred from the standpoint of ensuring device reliability. Heat occurs only within the second group III nitride layer 12 of the GaN substrate, and does not affect the surface device structure.

Second Group III Nitride Layer as Photothermal Layer

The following specifically describes a method for producing the second group III nitride layer 12 that serves as a photothermal layer having a transmittance of 0.1% or less for a laser beam of 400 to 700 nm wavelength.

The second group III nitride layer 12 is obtained by using OVPE method. OVPE method uses an oxide as a raw material, and the second group III nitride layer 12 to be grown may contain an oxide as impurities. The transmittance varies with the concentration of the oxygen contained in the second group III nitride layer 12, as shown in FIG. 6.

Figure 6:
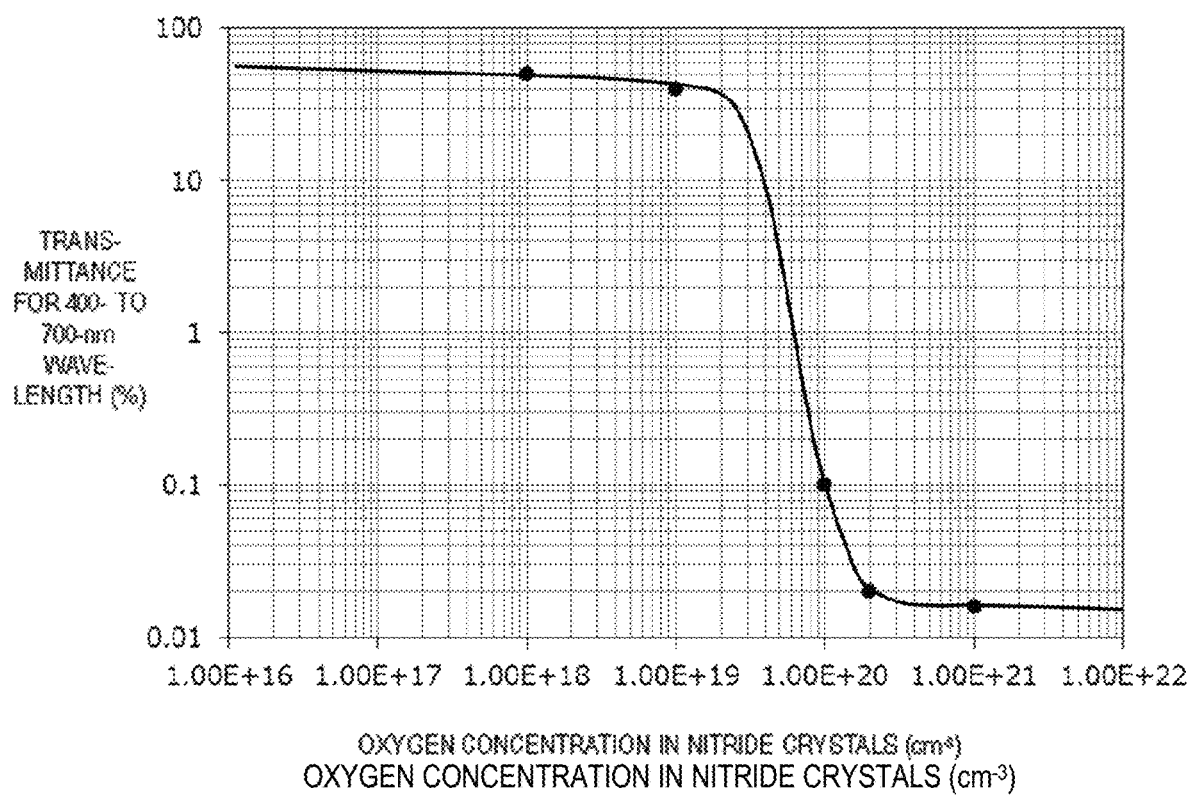
FIG. 6 is a diagram representing a relationship between nitride crystal oxygen concentration and transmittance.

FIG. 6 is a diagram representing a relationship between nitride crystal oxygen concentration and transmittance. As described above, the second group III nitride layer needs to have a transmittance of 0.1% or less for a laser beam of 400 to 700 nm wavelength to reduce the adverse effect of light on the device structure present on the front-surface side. Such a transmittance can be achieved, for example, when the oxygen concentration in the second group III nitride layer is $1×10^{20}$ cm$^{-3}$ or more, preferably $1×10^{21}$ cm$^{-3}$ or more, as shown in FIG. 6.

The second group III nitride layer 12 can have an oxygen concentration of $1×10^{20}$ cm$^{-3}$ or more when the mole number ratio of, for example, nitrogen in NH$_3$ as a group V feedstock gas with respect to, for example, gallium in Ga$_2$O as a group III feedstock gas is 100 or less, preferably 10 or less in the crystal growth performed at a substrate temperature of 1,200° C.

The value of oxygen concentration can be determined by secondary ion mass spectrometry (SIMS). The first group III nitride layer having a transmittance of 60% or more has an oxygen concentration of $1×10^{19}$ cm$^{-3}$ or less, as shown in FIG. 6.

The difference between the first and third group III nitride layers and the second group III nitride layer stems from the difference in the orientation of crystalline growth. Specifically, while the growth of the first group III nitride layer occurs predominantly parallel to the (0001) plane, the second group III nitride layer grows predominantly parallel to the facet planes consisting of the {10-1m}, {11-2n} planes (where m is an integer other than 0, and n is an even number).

The fabrication method described above forms the second group III nitride layer 12 within the GaN substrate using OVPE method, and the second group III nitride layer 12 formed has a low transmittance within the foregoing laser-beam wavelength range. In this way, the unfocused part of laser beam 20 that passes through toward the front-surface side becomes converted into heat in the second group III nitride layer 12, reducing heat in the device structure.

Group III Nitride Substrate Having Surface Device Structure After Division (FIG. 1D)

After the formation of the altered layer 18 by laser application, the GaN substrate 21 having the surface device structure, and the GaN substrate 22 having the altered layer 18 and the first transparent layer can be separated from each other with ease under a physical external force at the altered layer 18 forming a surface that serves as an initiation point of separation (FIG. 1D).

Figure 5A:
FIG. 5A is a schematic cross sectional view representing a step in an exemplary method of manufacture of a device from a GaN substrate.
Figure 5B:
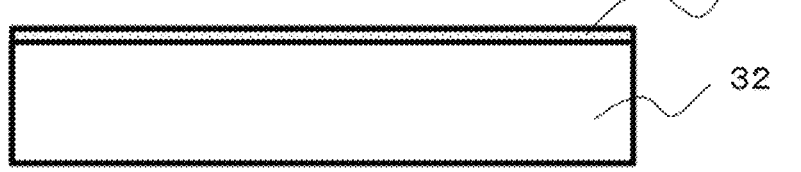
FIG. 5B is a schematic cross sectional view representing a step in an exemplary method of manufacture of a device from a GaN substrate.
Figure 5C:
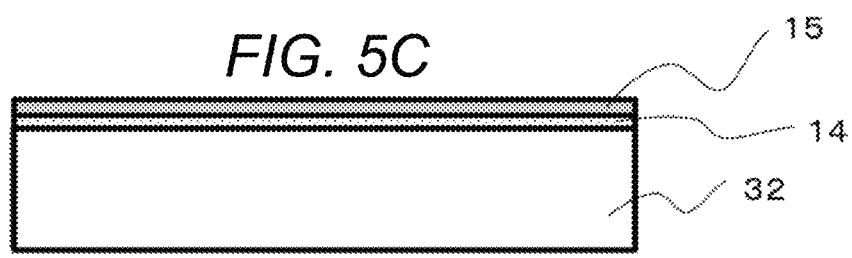
FIG. 5C is a schematic cross sectional view representing a step in an exemplary method of manufacture of a device from a GaN substrate.
Figure 5D:
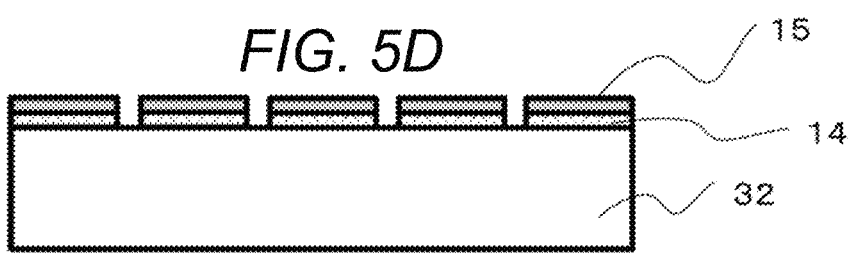
FIG. 5D is a schematic cross sectional view representing a step in an exemplary method of manufacture of a device from a GaN substrate.
Figure 5E:
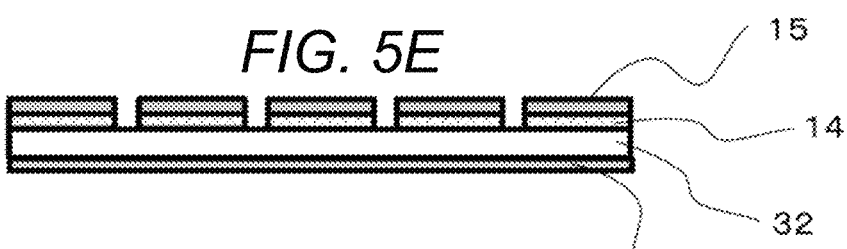
FIG. 5E is a schematic cross sectional view representing a step in an exemplary method of manufacture of a device from a GaN substrate.
Figure 5F:
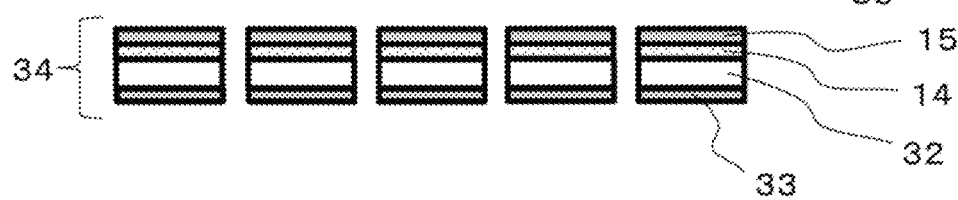
FIG. 5F is a schematic cross sectional view representing a step in an exemplary method of manufacture of a device from a GaN substrate.

After being separated, the GaN substrate 21 having the surface device structure is removed from the divider, and the back surface is ground or polished until the thickness becomes 100 μm or less. Here, the polishing removes the second group III nitride layer 12 and the joint interface 47. This is followed by formation of, for example, back electrodes, and the substrate is divided, as shown in FIGS. 5E and 5F, producing devices that are essentially no different from those produced by common manufacturing methods.

The GaN substrate 22, left with only the first group III nitride layer and having a thickness of 390 μm after the separation, can be used as a GaN substrate after grinding or polishing the surface to remove 20 μm of the layer, enabling effective use of the expensive GaN substrate materials.

An exemplary embodiment of the present disclosure is as described above. The embodiment described a configuration in which the substrate is divided once. However, the present disclosure is not limited to such a configuration, and the embodiment may be configured so that, for example, more than one photothermal layer is prepared, and the GaN substrate, with the photothermal layer sandwiched between the transparent layers, is divided multiple times in a repeated fashion.

The present embodiment has been described through the case of a configuration in which the group III nitride crystal is a GaN crystal. However, any materials may be used, provided that the crystal systems are the same. For example, it will be apparent that a similar embodiment using AlGaInN or AlN crystals produces the same effect.

The first group III nitride layer 11 may be a transparent substrate of other materials, for example, such as sapphire and ScAlMgO$_4$. Specifically, the first group III nitride layer 11 may be any substrate, provided that it has a transmittance of 60% or more for the predetermined wavelength of 400 nm to 700 nm. The second group III nitride layer 12 may be any layer, provided that it is a group III nitride layer formed on the first group III nitride layer 11 and having an impurity oxygen concentration of $1×10^{20}$ cm$^{-3}$ or more, and a transmittance of 0.1% or less for the predetermined wavelength.

The laser beam 17 may have a focal point 19 within the second group III nitride layer 12. Specifically, the laser beam 17 may be applied from the group III nitride layer side on the back-surface side of the substrate to form the internal altered layer 18 by multiphoton absorption, and the device 34 and the substrate may be divided from each other at the internal altered layer 18 serving as a boundary.

The device 34 may be formed on the second group III nitride layer 12, without providing the third group III nitride layer 13. The second group III nitride layer 12 has an impurity oxygen concentration of $1×10^{20}$ cm$^{-3}$ or more, and shows high electrical conductivity characteristics. This enables formation of high-quality devices.

The present disclosure encompasses appropriate combinations of any of the various embodiments and/or examples described above, and such combinations can produce the effects of the individual embodiments and/or examples.

A group III nitride semiconductor manufacturing method according to the present disclosure is applicable to the manufacturing method of a group III nitride semiconductor requiring reduced manufacturing costs.

What is claimed is:

1. A method for manufacturing a group III nitride semiconductor,
the method comprising:
preparing a group III nitride substrate having a first group III nitride layer and a second group III nitride layer laminated in this order from a back-surface side to a front-surface side, the first group III nitride layer being a layer having a transmittance of 60% or more for a predetermined wavelength of 400 nm to 700 nm, the second group III nitride layer being a layer provided on the first group III nitride layer and containing impurity oxygen in a concentration of $1×10^{20}$ cm$^{-3}$ or more and having a transmittance of 0.1% or less for the predetermined wavelength;
forming a device structure on the front-surface side of the group III nitride substrate; and
forming an internal altered layer in the first group III nitride layer by multiphoton absorption using a laser beam applied from the first group III nitride layer side on the back-surface side of the group III nitride substrate with a focal point set in front of the second group III nitride layer, and dividing the group III nitride substrate at the internal altered layer serving as a boundary.

2. The method according to claim 1, wherein the preparing of the group III nitride substrate includes:
preparing a seed substrate;
forming the first group III nitride layer on the seed substrate by crystalline growth;
separating the seed substrate;
grinding and polishing a front surface of the first group III nitride layer to planarize the surface;
forming the second group III nitride layer on another seed substrate by crystalline growth, using oxide vapor phase epitaxy method;
separating the another seed substrate;
grinding and polishing a front surface of the second group III nitride layer; and
bonding the separated first group III nitride layer and the separated second group III nitride layer to each other.

3. The method according to claim 1, wherein the preparing of the group III nitride substrate further includes forming a third group III nitride layer on the second group III nitride layer by crystalline growth, the third group III nitride layer being a layer having a transmittance of 60% or more for the predetermined wavelength.

4. The method according to claim 1, wherein the device structure comprises a functional layer, an electrode, and an insulating film.

5. The method according to claim 1, wherein the group III nitride substrate is formed of GaN.

6. A method for manufacturing a group III nitride semiconductor, the method comprising:
forming a first group III nitride layer having a transmittance of 60% or more for a predetermined wavelength of 400 nm to 700 nm;
forming a second group III nitride layer containing impurity oxygen in a concentration of $1 \times 10^{20}$ cm$^{-3}$ or more and having a transmittance of 0.1% or less for the predetermined wavelength;
laminating the first group III nitride layer to the second group III nitride layer;
forming a third group III nitride layer on the second group III nitride layer by crystalline growth, the third group III nitride layer being a layer having a transmittance of 60% or more for the predetermined wavelength;
forming a device structure on a front-surface side of the group III nitride substrate; and
forming an internal altered layer in the first group III nitride layer by multiphoton absorption using a laser beam applied from a back-surface side with a focal point set in front of the second group III nitride layer; and
dividing the group III nitride substrate at the internal altered layer serving as a boundary to remove a portion of the first group III nitride layer and thereby form the group III nitride semiconductor.

7. The method according to claim 6, using portion removed from the first group III nitride layer as the first group III nitride layer to form a second group III nitride semiconductor.

8. The method according to claim 6, wherein the forming of the second group III nitride layer by crystalline growth further includes performing crystalline growth on a seed substrate at a substrate temperature of 1,200° C. with a group V feedstock gas and a group III feedstock gas, wherein a mole number ratio of the group V feedstock gas to the group III feedstock gas is greater than 1 or less than 10.

* * * * *